(12) United States Patent
Kasuya

(10) Patent No.: US 6,528,414 B1
(45) Date of Patent: Mar. 4, 2003

(54) METHODS FOR FORMING WIRING LINE STRUCTURES IN SEMICONDUCTOR DEVICES

(75) Inventor: Yoshikazu Kasuya, Sakutu (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 09/376,879

(22) Filed: Aug. 18, 1999

(30) Foreign Application Priority Data

Aug. 18, 1998 (JP) .......................................... 10-232131
Jul. 19, 1999 (JP) .......................................... 11-204720

(51) Int. Cl.⁷ .......................................... H01L 21/4763
(52) U.S. Cl. ........................................ 438/637; 438/688
(58) Field of Search ............................... 438/614, 625, 438/636, 637, 642, 652, 672, 675, 688; 257/765, 771

(56) References Cited

U.S. PATENT DOCUMENTS

| | | | | |
|---|---|---|---|---|
| 4,931,410 A | * | 6/1990 | Tokunaga et al. | 438/618 |
| 5,169,803 A | * | 12/1992 | Miyakawa | 438/625 |
| 5,232,872 A | * | 8/1993 | Ohba | 438/648 |
| 5,242,860 A | * | 9/1993 | Nulman et al. | 438/653 |
| 5,341,014 A | * | 8/1994 | Fujii et al. | 257/377 |
| 5,534,460 A | * | 7/1996 | Tseng et al. | 438/672 |
| 5,652,180 A | * | 7/1997 | Shinriki et al. | 438/620 |
| 5,702,870 A | * | 12/1997 | Brugge | 430/314 |
| 5,721,146 A | * | 2/1998 | Liaw et al. | 438/302 |
| 5,789,317 A | * | 8/1998 | Batra et al. | 438/642 |
| 5,843,843 A | * | 12/1998 | Lee et al. | 438/688 |
| 5,851,917 A | * | 12/1998 | Lee | 438/627 |
| 5,926,736 A | * | 7/1999 | DeSilva | 438/637 |
| 5,985,751 A | * | 11/1999 | Koyama | 438/637 |
| 5,998,870 A | * | 12/1999 | Lee et al. | 257/751 |
| 6,057,236 A | * | 5/2000 | Clevenger et al. | 438/680 |
| 6,060,390 A | | 5/2000 | Naito et al. | 438/656 |

FOREIGN PATENT DOCUMENTS

| | | |
|---|---|---|
| JP | 6-69307 | 3/1994 |
| JP | 8274101 | 10/1996 |
| JP | 9069565 | 3/1997 |
| JP | 9172017 | 6/1997 |
| JP | 9298238 | 11/1997 |
| JP | 10064908 | 3/1998 |

OTHER PUBLICATIONS

Translation of "Decision of Refusal" for Japanese Patent Application No. 11–204720, dispatch date Apr. 10, 2001.

* cited by examiner

Primary Examiner—Olik Chaudhuri
Assistant Examiner—Ginette Peralta
(74) Attorney, Agent, or Firm—Konrad Raynes Victor & Mann, LLP; Alan S. Raynes

(57) ABSTRACT

Embodiments include a manufacturing method for a semiconductor device which can suppress a concave from being generated in an upper area of a wiring layer at a position above plug. The method may include the steps of (a) forming an impurity diffusion layer 34; (b) forming, on the impurity diffusion layer 34, an interlayer insulating layer 40 having at least one. through hole 42; (c) forming a plug 50 in the through hole 42; (d) forming an underlying layer 62 on the plug 50 and the interlayer insulating layer 40, and (e) forming an aluminum layer 64 on the underlying layer 62, the aluminum layer 64 being formed at a substrate temperature not lower than 250° C. and under a reduced pressure.

3 Claims, 9 Drawing Sheets

METHODS FOR FORMING WIRING LINE STRUCTURES IN SEMICONDUCTOR DEVICES

FIELD OF THE INVENTION

The present invention relates to manufacturing methods for semiconductor devices and semiconductor devices, and more particularly to methods of forming wiring layers and wiring line structures. Preferred embodiments of the present invention relate to methods of forming a wiring layer which is formed on an interlayer insulating layer and is connected to a conductive layer via a through hole and devices having such a structure.

BACKGROUND

With the progress in miniaturization and integration of semiconductor devices, multilayer wiring techniques have been hitherto employed in manufacture of the semiconductor devices. Here, the multilayer wiring techniques mean techniques for forming a wiring layer of a multilayer structure. Recently, the demand for further miniaturization and higher integration of semiconductor devices has been increasing more and more. An improvement of multilayer wiring techniques is essential to meet the above demand. For achieving improved multilayer wiring techniques, it is an important problem to improve the method of forming each wiring layer.

SUMMARY

Preferred embodiments relate to manufacturing methods for semiconductor devices and semiconductor devices, including methods of forming wiring layers and wiring line structures.

One embodiment relates to a method for manufacturing a semiconductor device including forming a conductive layer on or above a substrate and forming, on the conductive layer, an interlayer insulating layer having at least one through hole therein. The method also includes forming a plug in the through hole and forming an underlying layer on the plug and the interlayer insulating layer. A layer including aluminum is formed on the underlying layer, with the aluminum layer being formed at a substrate temperature not lower than 250° C. and under a reduced pressure.

Another embodiment relates to a method for forming a semiconductor device, including forming a conductive layer on or above a substrate and forming, on the conductive layer, an insulating layer having at least one through hole therein. A plug is formed in the through hole and an underlying layer is formed on at least a portion of the plug. A layer comprising aluminum is formed on the underlying layer while maintaining a chamber pressure of not greater than approximately 1 Pa.

Yet another embodiment relates to a method for forming a semiconductor device, including forming a first conductive layer on or above a substrate and forming, on the first conductive layer, an insulating layer having at least one through hole therein. A plug is formed in the through hole and an underlying layer formed on or over at least a portion of the plug and the insulating layer. A second conductive layer is formed on or over the underlying layer while maintaining a chamber pressure of not greater than approximately 5 Pa. The second conductive layer is maintained at a temperature below its melting point while forming the semiconductor device.

DETAILED DESCRIPTION

Figure 6:
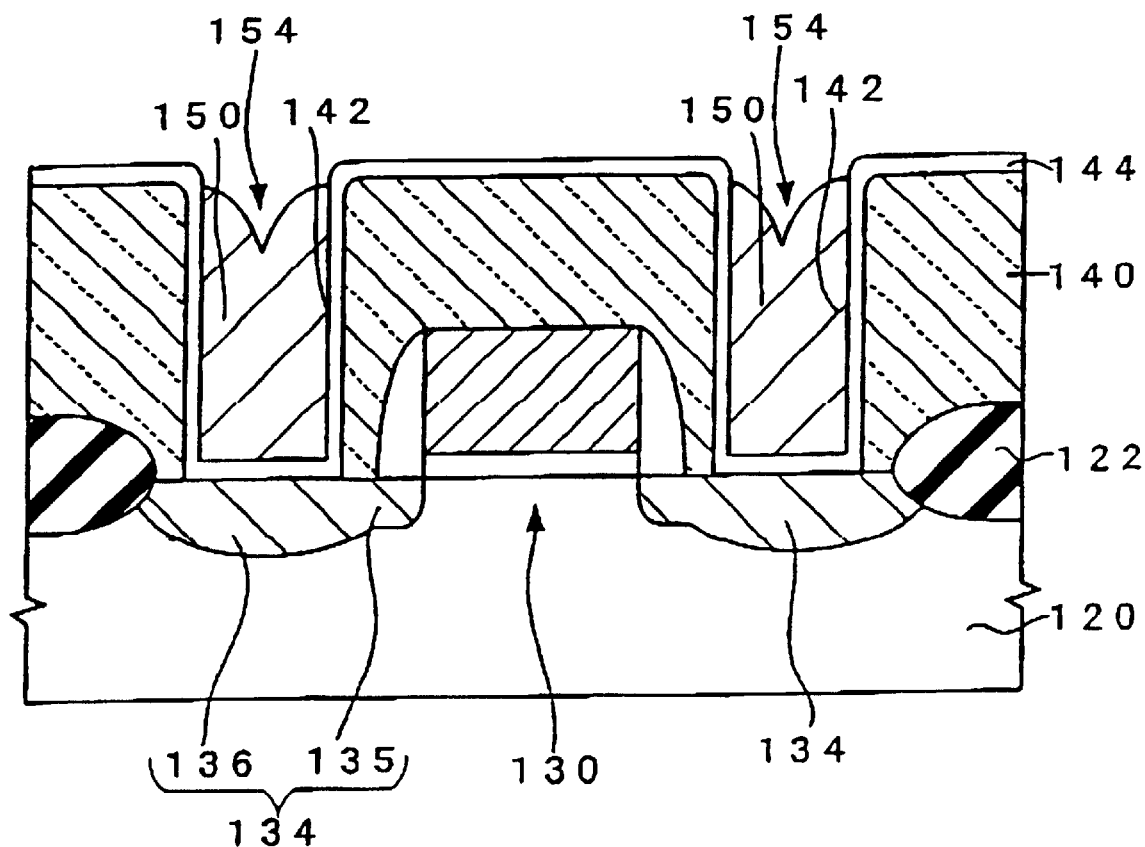
FIG. 6 is a sectional view schematically showing a step of a general method of forming a wiring layer.

A usual method of forming a wiring layer will be described below with reference to FIGS. 6 and 7. First referring to FIG. 6, a MOS element 130 is formed on the surface of a substrate 12 by a method as known in the art. An interlayer insulating layer 140 is formed on the substrate 120. Predetermined areas of the interlayer insulating layer 140 are etched by the lithography technique to form through holes 142. Each through hole 142 reaches an upper surface of an impurity diffusion layer (a layer forming a source or drain region) 134 of the MOS element 130.

A barrier metal layer 144 is then formed on the surface of the substrate 120. Specifically, the barrier metal layer 144 is formed on surfaces defining each through hole 142 and the surface of the interlayer insulating layer 140. A plug 150 is formed in the through hole 142. A manner of forming the plug 150 is as follows. A deposit layer (not shown) for the plug 150 is formed on the barrier metal layer 144. The deposit layer is formed so as to fill the through hole 142. The deposit layer is made of, e.g., tungsten. The deposit layer is then etched back. After that, the deposit layer is over-etched to form the plug 150. Over-etching of the deposit layer intends to prevent a conductive material, which forms the deposit layer, from remaining on the surface of the barrier metal layer 144. The over-etching of the deposit layer generates a concave (referred to as a "recess" hereinafter) 154 at the top of the plug 150.

Figure 7:
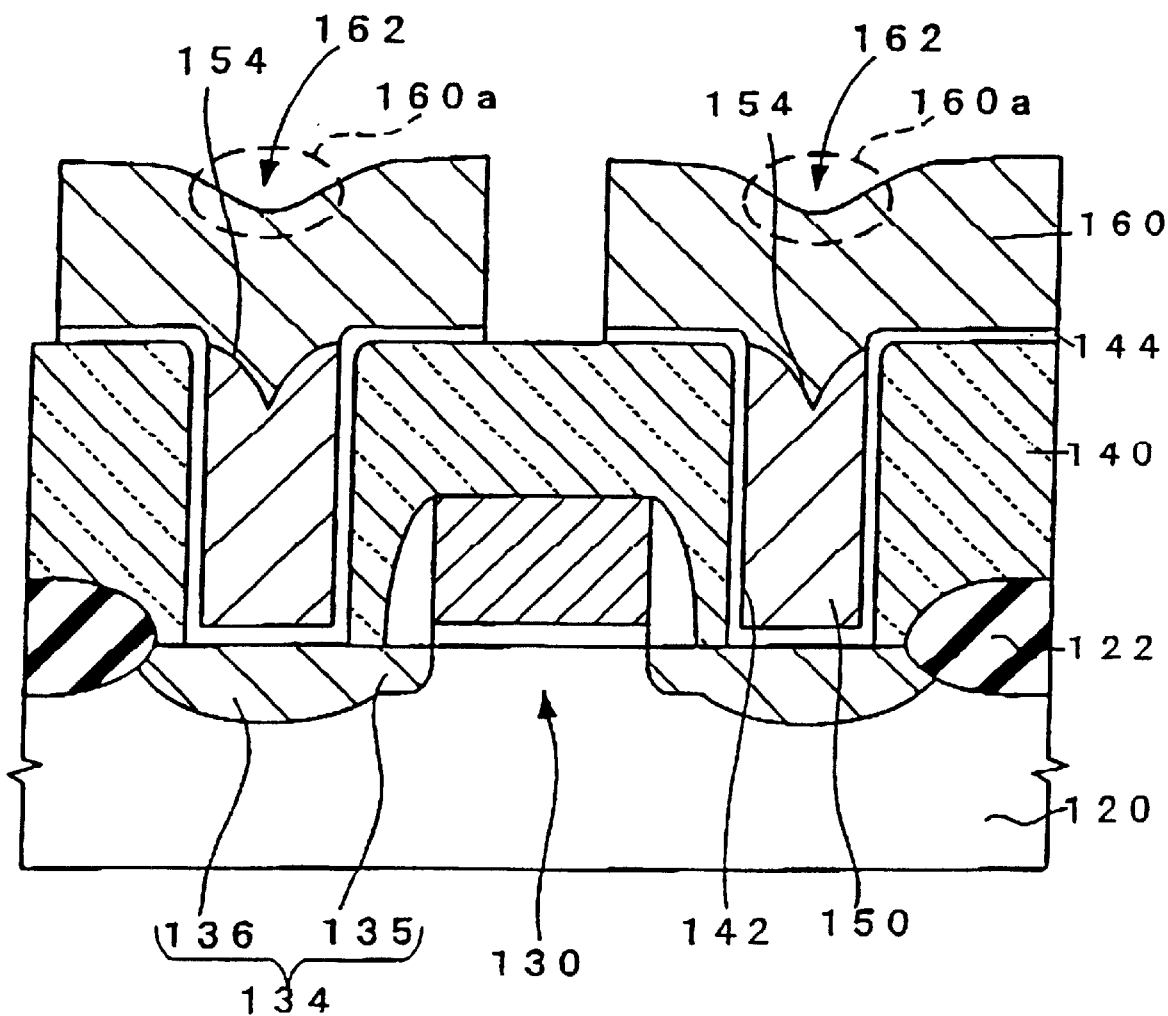
FIG. 7 is a sectional view schematically showing a step of the general method of forming the wiring layer.

Next, as shown in FIG. 7, a wiring layer (e.g., an aluminum layer) 160 is formed on the plug 150 and the barrier metal layer 144. The wiring layer 160 is then patterned by lithography. However, the following problem may arise when the wiring layer 160 is formed as described above. With the above technique, the deposit layer is over-etched to form the plug 150. The recess 154 is therefore generated at the top of the plug 150. By forming the wiring layer 160 in a state that the recess 154 is generated, there may occur such a problem that a concave (referred to as a "wiring layer concave" hereinafter) 162 is generated in an upper area 160a of the wiring layer 160 at a position above the recess 154. The presence of the wiring layer concave 162 makes it difficult to form, e.g., a stacked via. The stacked via means a via hole formed in an interlayer insulating layer, which is formed on a wiring layer, at a position above a corresponding through hole.

Figure 8:
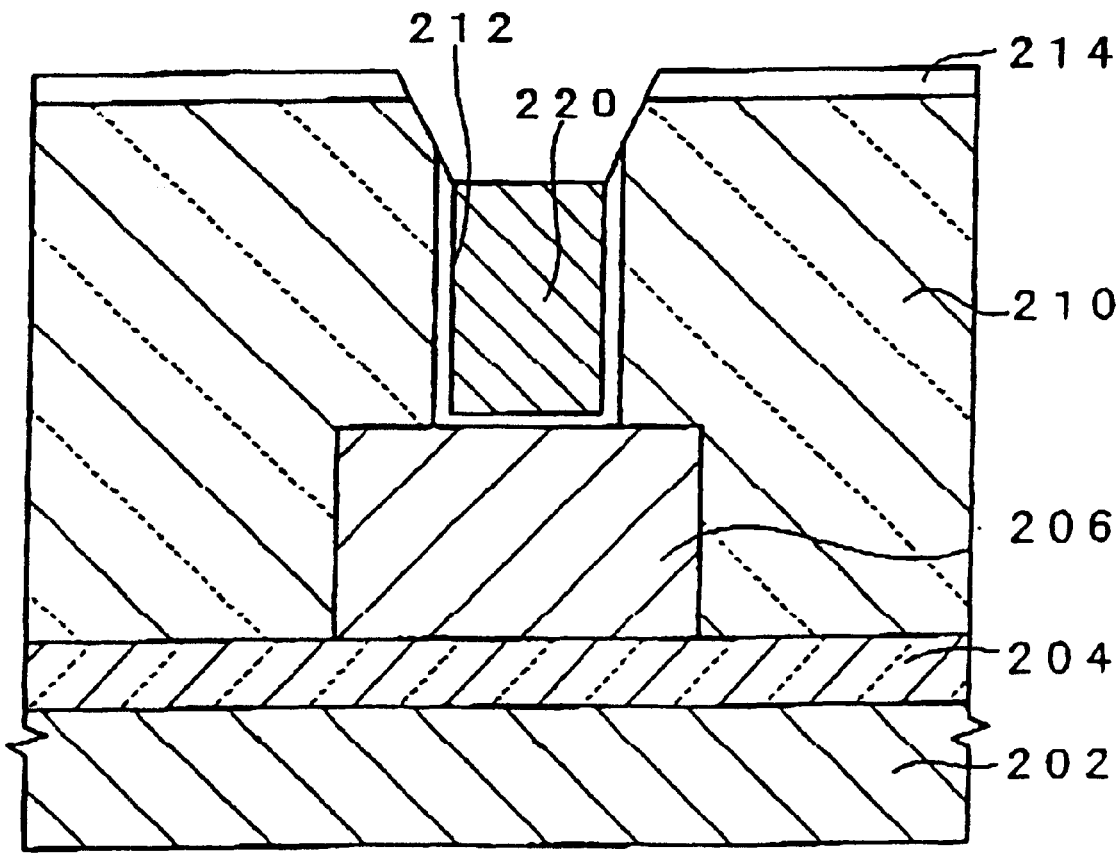
FIG. 8 is a sectional view schematically showing a step of a method of forming a wiring layer according to the related art 1.
Figure 9:
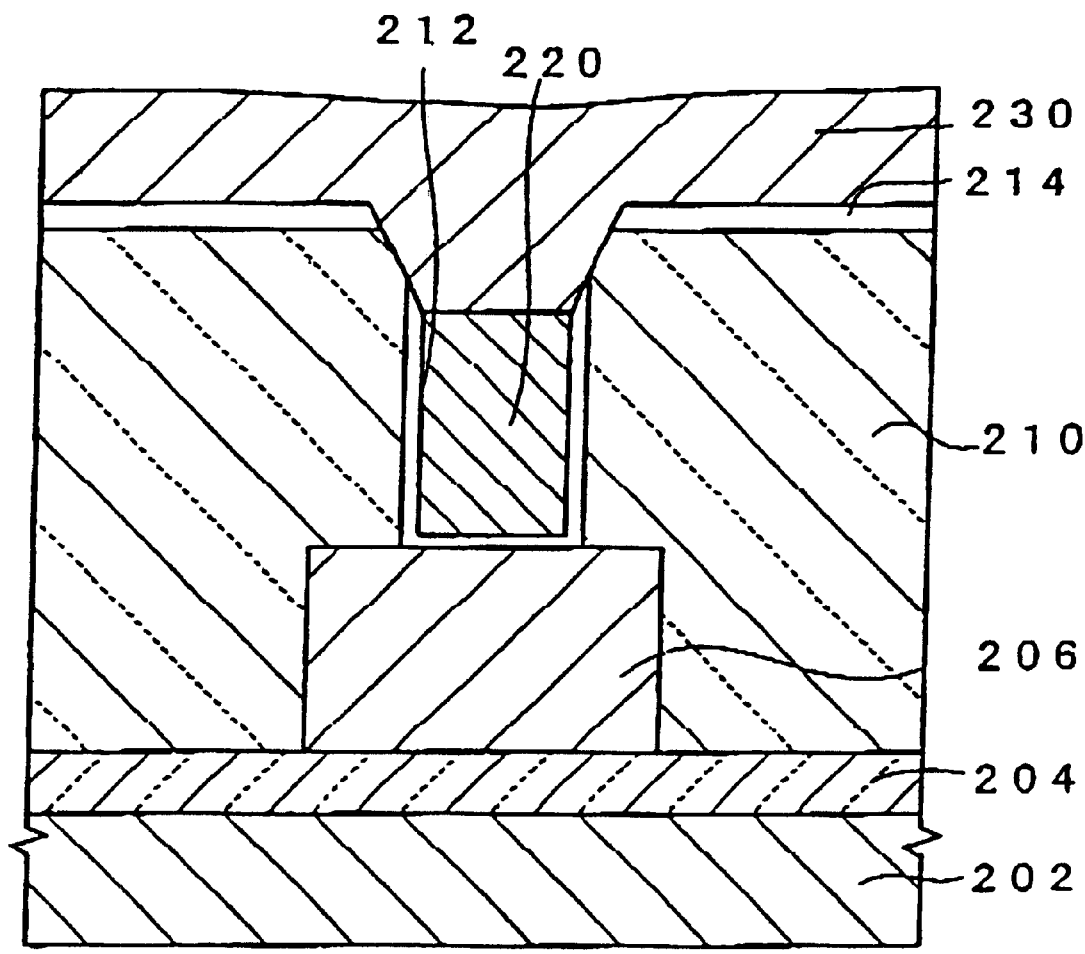
FIG. 9 is a sectional view schematically showing a step of the method of forming the wiring layer according to the related art 1.

The following two techniques are proposed with a view of preventing the wiring layer concave from being generated. The first technique is one disclosed in Japanese Unexamined Patent Publication No. 9-172017 (referred to as "related art 1" hereinafter). The gist of the related art 1 will be described below with reference to FIG. 8. An interlayer insulating film 210 is formed on an underlying oxide film 204 and a lower metal wiring layer 206. The interlayer insulating film 210 has a connection hole 212. A conductive material 220 is buried in the connection hole 212. An upper end portion of the connection hole 212 is machined by sputtering etching using argon ions. As a result, the upper end portion of the connection hole 212 has a gentle slope. In other words, the machining is carried out so as to increase the width of the connection hole 212 at the top thereof. After the machining, as shown in FIG. 9, an upper wiring layer 230 is formed with an improved coverage property. Thus, with the related art 1, the upper end portion of the connection hole 212 is machined to improve the coverage property of the upper wiring layer 230 and hence to prevent a concave from being generated in the upper wiring layer 230.

Figure 10:
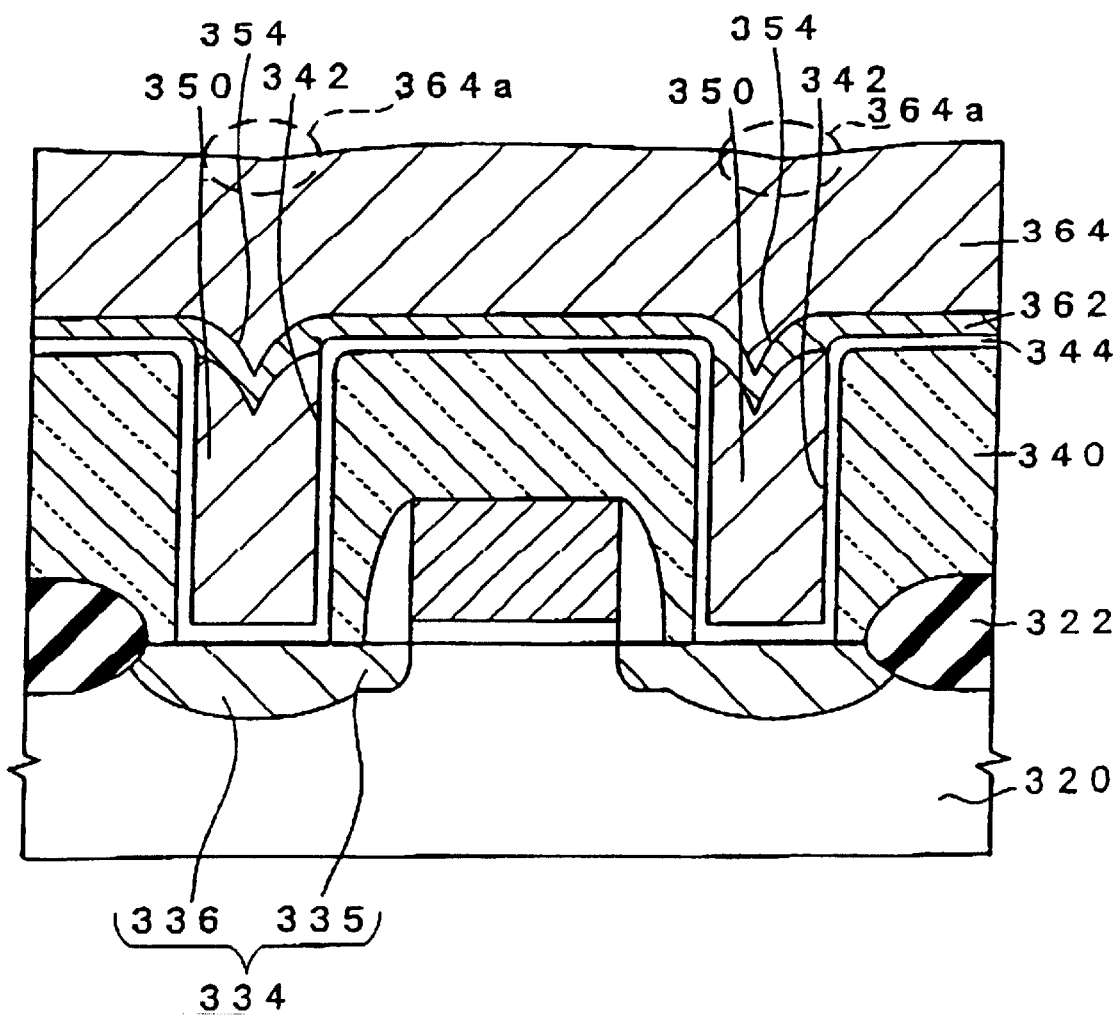
FIG. 10 is a sectional view schematically showing a step of a method of forming a wiring layer according to the related art 2.

The second technique is one disclosed in Japanese Unexamined Patent Publication No. 9-298238 (referred to as "related art 2" hereinafter). The gist of the related art 2 will be described below with reference to FIG. 10. An interlayer insulating film 340 is formed on a substrate 320. Contact holes 342 are formed in the interlayer insulating film 340. Plugs 350 are formed in the contact holes 342. An underlying layer 362 is formed over the entire surface of the substrate including the surfaces of the plugs 350. After forming the underlying layer 362, a wiring layer 364 made of an aluminum alloy is deposited. After forming the wiring layer 364, the substrate 320 is heated so as to cause reflow of the wiring layer 364. Thus, with the related art 2, a concave is minimized in an upper area 364a of the wiring layer 364 at a position above a recess 354 by causing reflow of the wiring layer 364.

The related art 1 and the related art 2 however have a variety of problems, including the following. With the related art 1, the upper end portion of the connection hole 212 in the interlayer insulating film 210 is removed by sputtering etching using argon ions. The related art 1 therefore gives rise to the problem of generating a large number of particles and deteriorating yield.

The related art 2 requires the step of causing reflow of the wiring layer 364, and therefore has the problem of increasing the number of steps. Also, because the reflow step is carried out at high substrate temperatures not less than 450° C., semiconductor elements, etc. may be adversely affected.

Certain embodiments of the present invention provide a manufacturing method for a semiconductor device which can suppress a concave from being generated in an upper area of a wiring layer at a position above a plug, and can form the wiring layer having a flat surface.

A manufacturing method for a semiconductor device according to one preferred embodiment of the present invention comprises the steps of: (a) forming a conductive layer, (b) forming, on the conductive layer, an interlayer insulating layer having at least one through hole, (c) forming a plug in the through hole, (d) forming an underlying layer on the plug and the interlayer insulating layer, and (e) forming an aluminum layer on the underlying layer, the aluminum layer being formed at a substrate temperature not lower than about 250° C. and under a reduced pressure.

By forming the aluminum layer as set forth above, movement of aluminum atoms can be promoted on the underlying layer during the formation of the aluminum layer. With the present invention, therefore, it is possible to suppress a concave from being generated in an upper area of the aluminum layer at a position above the plug, and to form the aluminum layer having a flat surface.

Also, certain embodiments carry out steps (d) and (e) in a continuous manner. By carrying out the steps (d) and (e) in a continuous manner to form the aluminum layer, the generation of a concave in the upper area of the aluminum layer can be suppressed with higher reliability.

The step (e) is preferably carried out under a reduced pressure at which the pressure is not higher than about 1.0 Pa. Also, the step (e) is preferably carried out by the sputtering process. The material of the aluminum layer may preferably be aluminum or an alloy containing aluminum as a main component.

The substrate temperature is preferably in the range of 280° C.–360° C. By setting the substrate temperature to be not lower than 280° C., the aluminum layer can be formed with a more satisfactory result. On the other hand, by setting the substrate temperature to be not higher than 360° C., an adverse effect upon elements, etc. can be minimized.

The underlying layer formed in the step (d) may in certain embodiments act to improve wettability between the layer formed below the underlying layer and the aluminum layer. The underlying layer may preferably be made of, e.g., a material such as a metal having a high melting point, a nitride of a metal having a high melting point, or an alloy of a metal having a high melting point.

Certain preferred manufacturing methods for forming semiconductor devices may further comprise, after the step (e), a step (f) of forming a reflection preventive film. In embodiments including the step (f), the step (f) may preferably be carried out in a continuous relation to the step (e). In certain embodiments, the continuous processing means that the formation of forming layers without exposing the wafer to the atmosphere between the processing steps. This may in certain embodiments include transferring the wafer from one processing chamber to another processing chamber within a larger processing apparatus.

The conductive layer may preferably be, e.g., any of the following three forms; 1) a diffusion layer formed in a substrate, 2) wiring formed on the surface of the substrate, and 3) wiring formed on an interlayer insulating layer.

Embodiments of the present invention such as those described above are especially useful for the case in which a recess is generated at a position above the plug. Certain preferred embodiments of the present invention will be described below with reference to the drawings. Such embodiments include processing methods and devices manufactured according to the methods.

Figure 1:
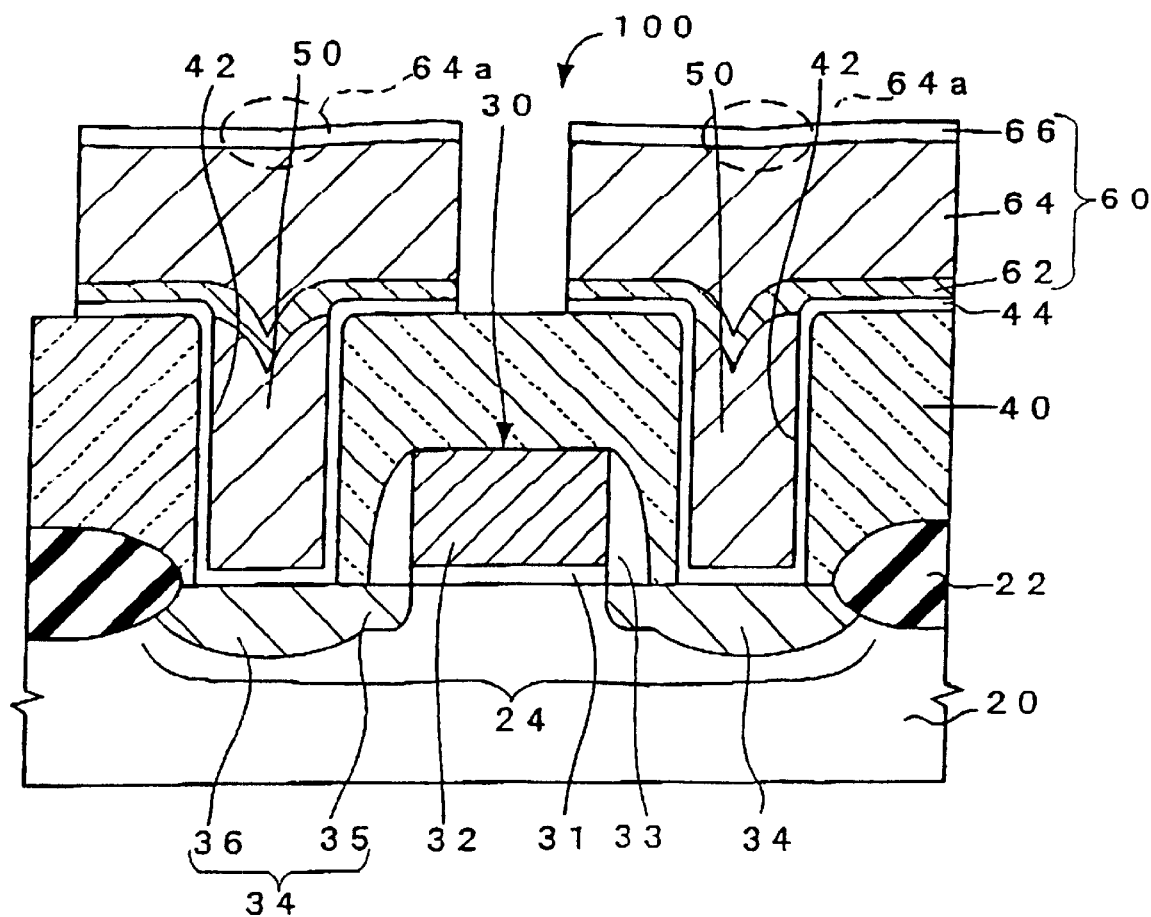
FIG. 1 is a sectional view schematically showing a semiconductor device according to an embodiment.
Figure 2:
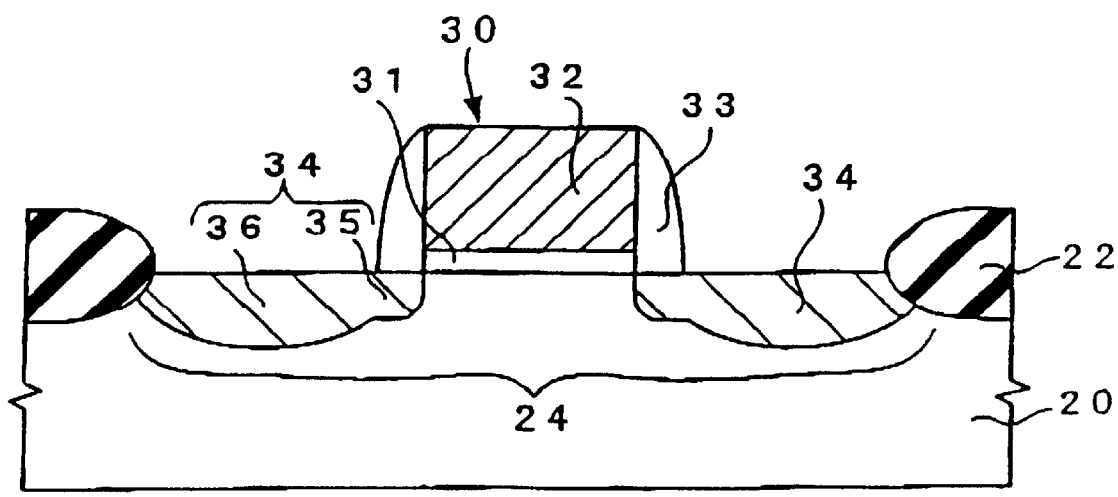
FIG. 2 is a sectional view schematically showing a manufacture step of the semiconductor device according to the embodiment.

FIG. 1 is a schematic view of a semiconductor device 100 according to one embodiment. A field insulating layer 22 is formed on the surface of a p-type silicon substrate (referred to as a "substrate" hereinafter) 20. An active region 24 is defined by the field insulating layer 22. A MOS element 30 is formed in the active region 24. The MOS element 30 comprises a gate oxide film 31, a gate electrode 32, and n-type impurity diffusion layers 34. The gate oxide film 31 is formed on the surface of the substrate 20. The gate electrode 32 is formed on the gate oxide film 31. The gate electrode 32 is formed of a polycrystalline silicon layer, for example, and contains an impurity doped therein. A side wall spacer 33 is formed so as to cover side walls of both the gate oxide film 31 and the gate electrode 32. Each of the n-type impurity diffusion layers 34 forms a source or drain region. The n-type impurity diffusion layer 34 has an LDD structure comprising a low-density n-type impurity diffusion layer 35 and a high-density n-type impurity diffusion layer 36.

An interlayer insulating layer 40 is formed on the substrate 20. Predetermined areas of the interlayer insulating layer 40 are removed to form through holes 42. Each through hole 42 reaches the n-type impurity diffusion layer 34. A barrier layer 44 is formed on surfaces defining each through hole 42 and an upper surface of the interlayer insulating layer 40. The barrier layer 44 functions as a barrier. The barrier layer 44 may also function as an adhesion layer for increasing adhesion between the interlayer insulating layer 40 and a plug 50. The plug 50 is formed in the through hole 42. A wiring layer 60 may be formed on an upper surface of the plug 50 and an upper surface of the barrier layer 44. The wiring layer 60 has a predetermined pattern, and may comprise an underlying layer 62, an aluminum layer 64 and a reflection preventive film 66.

A manufacturing method for a semiconductor device according to an embodiment will be described below. FIGS. 2 to 5 are sectional views schematically showing manufacturing steps of such a semiconductor device according to the embodiment. The embodiment may include the formation of an element to interlayer insulating layer having a through hole therein. First referring to FIG. 2, an n-type MOS element 30 is formed on the substrate 20 by a generally used method. More specifically, the n-type MOS element 30 may be formed, by way of example, as follows. The field insulating layer 22 is formed on the substrate 20 by selective oxidation. An active region 24 is defined upon the formation of the field insulating layer 22. The gate oxide film 31 is formed in the active region 24 by dry oxidation. After adjusting the threshold voltage with channel injection, a poly-silicon layer is formed. The poly-silicon layer is formed through growth of poly-silicon that is developed by the pyrolysis of monosilane ($SiH_4$). The gate electrode 32 is formed by etching the poly-silicon layer into a predetermined pattern.

The low-density n-type impurity diffusion layer 35 of the source or drain region is then formed by ion injection of phosphorous into the substrate. Subsequently, the side wall spacer 33 of a silicon oxide film is formed at the side of the gate electrode 32. After that, the high-density n-type impurity diffusion layer 36 is formed in the source or drain region by carrying out ion injection of arsenic and activating the impurity with annealing using a halogen lamp. The n-type impurity diffusion layer 34 having an LDD structure is thus formed, whereby the n-type MOS element 30 is formed.

Figure 3:
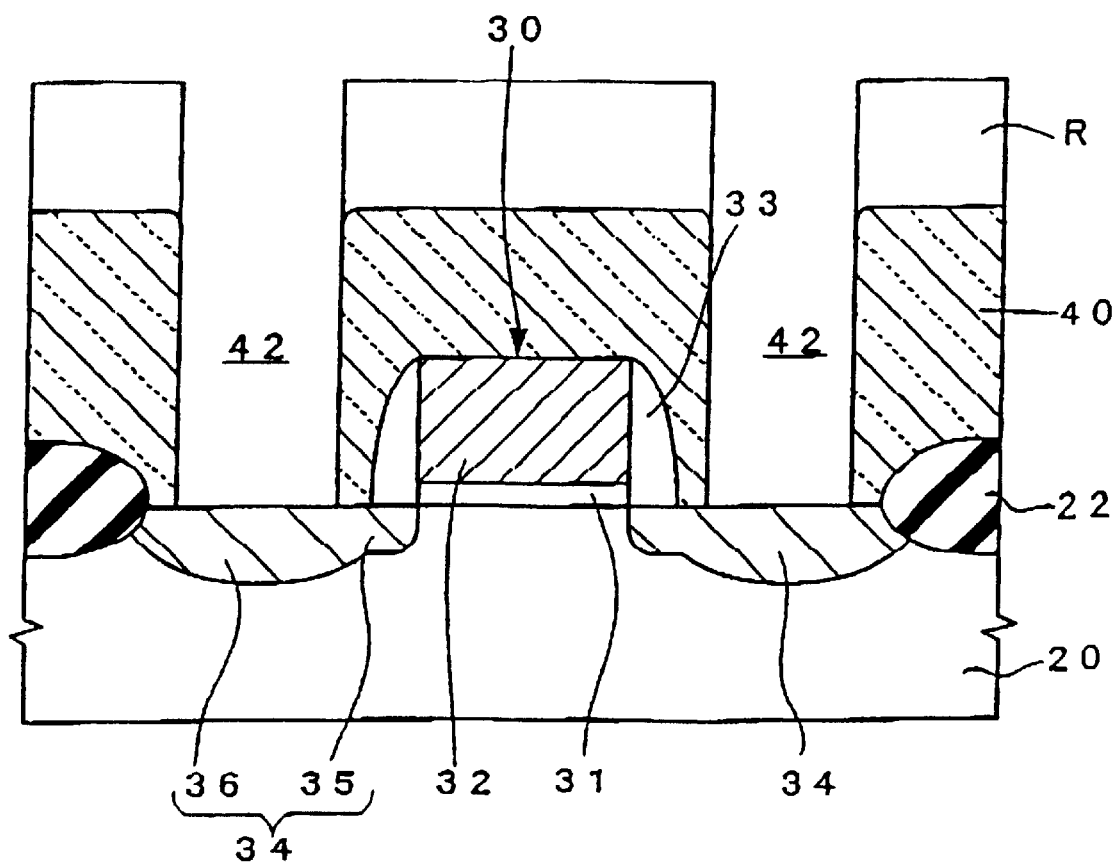
FIG. 3 is a sectional view schematically showing a manufacture step of the semiconductor device according to the embodiment.

Next, as shown in FIG. 3, the interlayer insulating layer 40 is formed on the substrate 20. The film thickness of the interlayer insulating layer 40 is not particularly limited and is held, for example, in the range of about 500 nm to about 1500 nm. The material of the interlayer insulating layer 40 can be a material such as, for example, silicon oxide. When silicon oxide is used as the material of the interlayer insulating layer 40, the silicon oxide may contain arsenic, phosphorous, boron or the like. Examples of methods usable for forming the interlayer insulating layer 40 include high-density plasma CVD, thermal CVD, plasma CVD, normal pressure CVD, coating (utilizing SOG (spin-on-glass)) such as spin coating, sputtering, and vapor deposition process. In the case of forming the interlayer insulating layer 40 by the plasma CVD process, it is preferably formed using an RF plasma CVD apparatus provided with parallel flat plates. When a RF plasma CVD apparatus provided with parallel flat plates is used to form the interlayer insulating layer 40, tetraethoxysilane (TEOS) may preferably be employed as a gas. Further, if required, the interlayer insulating layer 40 may be flattened by a method such as the CMP (chemical mechanical polishing) process.

Then, a resist layer R having a predetermined pattern may be formed on the interlayer insulating layer 40. The resist layer R may then be patterned by lithography. The resist layer R is opened at a position above an area of the interlayer insulating layer 40 in which the through hole 42 is to be formed.

Then, the through hole 42 is formed by etching the interlayer insulating layer 40 with the resist layer R serving as a mask. The method of etching the interlayer insulating layer 40 is not particularly limited and is carried out by, e.g., dry etching. Subsequently, the resist layer R may be removed by ashing with oxygen plasma or dissolving.

Figure 4:
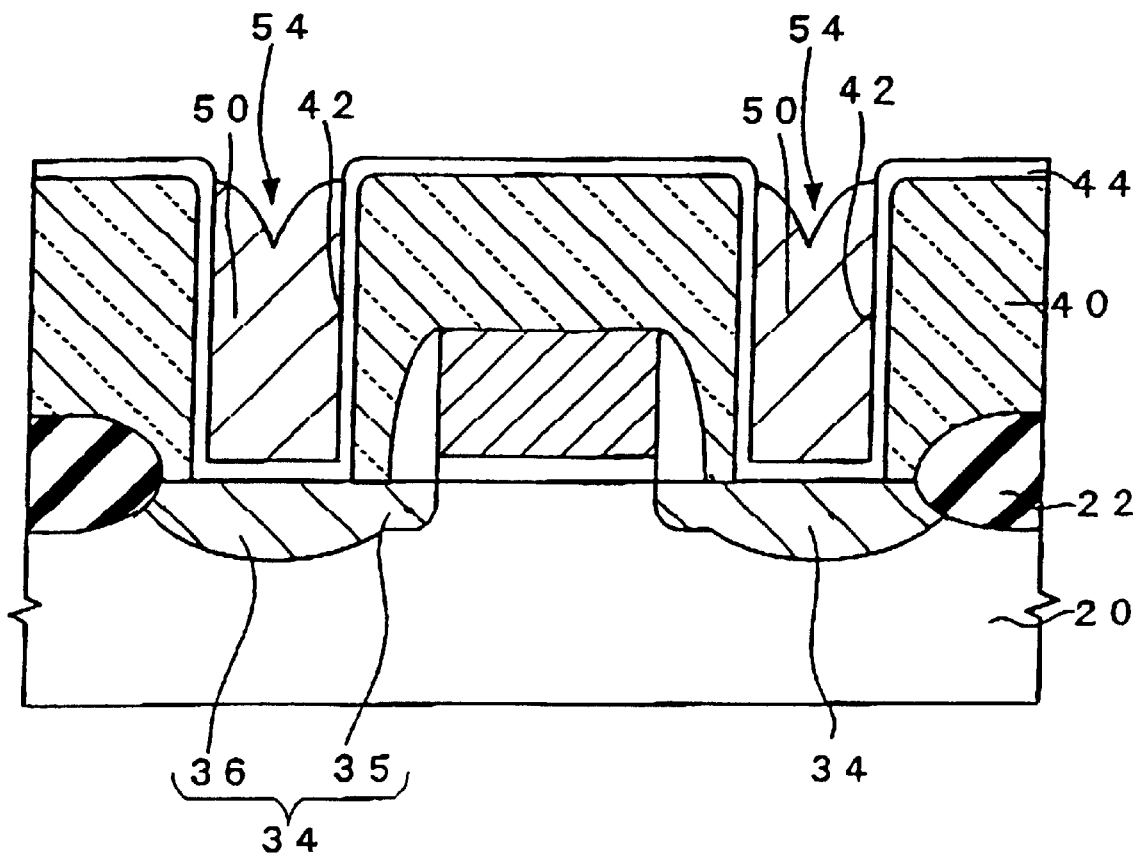
FIG. 4 is a sectional view schematically showing a manufacture step of the semiconductor device according to the embodiment.

Next referring to FIG. 4, the barrier layer 44 is formed on the surfaces defining each through hole 42 and the upper surface of the interlayer insulating layer 40. Functions of the barrier layer 44 will be described in connection with the later-described formation of the plug 50. The method of forming the barrier layer 44 can be, e.g., the sputtering process. The material of the barrier layer 44 is not particularly limited so long as it can develop the functions of the barrier layer 44. Specific examples of a material usable for the barrier layer 44 include metals having high melting points such as titanium and tungsten, alloys of metals having high melting points such as titanium tungsten (TiW), nitrides of transition metals, borides of transition metals, carbides of transition metals, and silicides of transition metals. More specifically, the barrier layer 44 may in certain embodiments be formed of, for example, a two-layer structure comprising a titanium layer and a titanium nitride layer, a single layer of titanium nitride, a single layer of titanium tungsten, or a two-layer structure comprising a titanium nitride layer and a titanium tungsten layer. Among those examples, the two-layer structure comprising a titanium layer and a titanium nitride layer is preferable. When the barrier layer 44 has a two-layer structure comprising a titanium layer and a titanium nitride layer, the barrier layer 44 may be formed by depositing a titanium layer and a titanium nitride layer successively. In the case of forming the titanium layer and the titanium nitride layer by the sputtering process, these layers can be continuously formed under a reduced pressure. Here, the term "reduced pressure" may include a condition in which the pressure is not higher than 5 Pa, more preferably not higher than 1.0 Pa, even more preferably not higher than 0.5 Pa. The film thickness of the titanium layer is, for example, in the range of 5–50 nm and the film thickness of the titanium nitride layer is, for example, in the range of 10–100 mn.

Then, the plug 50 is formed in the through hole 42. The plug 50 is formed, by way of example, as follows. A deposit layer used to form the plug 50 is formed on the barrier layer 44. The deposit layer is formed so as to fill the through hole 42. The method of forming the deposit layer can be, e.g., the CVD process. The material of the deposit layer is not particularly limited so long as it is electrically conductive, and can be selected from among, e.g., tungsten, aluminum, an aluminum alloy, copper and a copper alloy. Because the barrier layer 44 is already formed when forming the deposit layer, adhesion between a conductive material (the conductive material forming the deposit layer) and the interlayer insulating layer 40 is improved, allowing the conductive material to be satisfactorily filled in the through hole 42. Also, the barrier layer 44 has such a function that when the deposit layer is made of tungsten, the presence of the barrier layer 44 prevents diffusion of a tungsten hexafluoride gas into the substrate 20, the gas being produced in the step of depositing tungsten by the CVD process.

The deposit layer is then etched back to form the plug 50. Usually, the deposit layer is etched back by over-etching. Over-etching of the deposit layer is carried out to prevent the deposit layer from remaining on the surface of the barrier layer 44. The over-etching of the deposit layer generates a recess 54 (see FIG. 5) at the top of the plug 50. The recess 54 may be substantially concave in shape.

Figure 5:
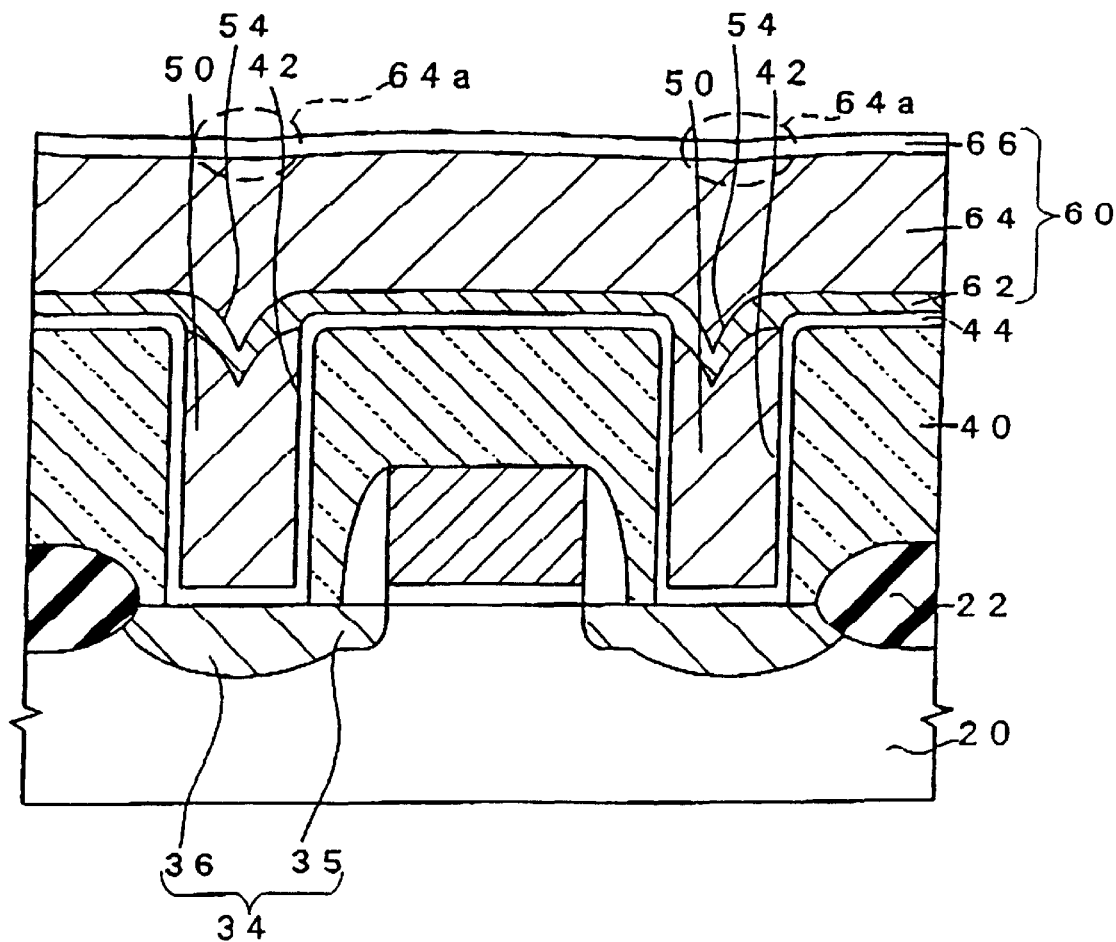
FIG. 5 is a sectional view schematically showing a manufacture step of the semiconductor device according to the embodiment.

Next referring to FIG. 5, the wiring layer 60 is formed on the barrier layer 44. The wiring layer 60 is preferably formed by successively depositing the underlying layer 62, the aluminum layer 64 and the reflection preventive film 66. More specifically, the wiring layer 60 is formed as follows.

First, the underlying layer 62 is formed on the barrier layer 44. The underlying layer 62 serves to improve wettability of the aluminum layer 64, which is formed in a later step, with respect to the interlayer insulating layer 40 and the plug 50. Also, the underlying layer 62 has a function to prevent abnormal growth (e.g., generation of whiskers) of aluminum which may occur when the aluminum layer 64 is formed at high temperatures. The material of the underlying layer 62 is not particularly limited so long as it can perform the functions of the underlying layer 62. Examples of materials usable for the underlying layer 62 include metals having high melting points, nitrides of metals having high melting points, and alloys of metals having high melting points. The metals having high melting points can be, e.g., titanium (Ti), tantalum (Ta), niobium (Nb), vanadium (V), chromium (Cr), molybdenum (Mo), zirconium (Zr), hafnium (Hf) and tungsten (W). One example of the nitrides of metals having high melting points is titanium nitride (TiN). One example of an alloy of metal having a high melting point is titanium tungsten (TiW). The material of the underlying layer 62 is preferably titanium (metal having a high melting point). Titanium has good wettability with respect to aluminum, and is suitable for the case in which the recess 54 is large. In the case in which the recess 54 is not so large, titanium nitride (nitride of the metal having a high melting point) and titanium tungsten (alloy of the metals having high melting points) are each suitable as the material of the underlying layer 62. Examples of the method usable for forming the underlying layer 62 include the sputtering, CVD, ion plating, and vapor deposition process. The underlying layer 62 is preferably formed by the sputtering process. Further, the underlying layer 62 is preferably formed under a reduced pressure. One preferred pressure value includes a pressure not higher than 1.0 Pa, more preferably not higher than 0.5 Pa. Other embodiments may utilize other pressures, for example, 5 Pa. The film thickness of the underlying layer 62 is not particularly limited so long as it can develop the functions of the underlying layer 62, and is held, for example, in the range of 5–50 nm.

Then, the aluminum layer 64 is formed on the underlying layer 62. The aluminum layer 64 is preferably formed by the sputtering process. The aluminum layer 64 is preferably formed under a reduced pressure; for example, under a pressure not higher than 1.0 Pa, more preferably not higher than 0.5 Pa. Also, the aluminum layer 64 is formed on condition that the temperature of the substrate 20 is preferably not lower than 250° C., more preferably in the range of 280° C.–360° C. By forming the aluminum layer 64 on the underlying layer 62 at the temperature of the substrate 20 being not lower than 250° C. and under the reduced pressure, movement of aluminum atoms on the substrate 20 is so promoted as to suppress generation of a concave in an upper area 64a of the aluminum layer 64 at a position above the recess 54. Further, by setting the temperature of the substrate 20 to be not lower than 280° C., the movement of aluminum atoms is more promoted. In addition, by setting the temperature of the substrate 20 to be not higher than 300° C., it is possible to minimize an adverse effect that may act upon the semiconductor element due to heat. When the underlying layer 62 is formed by the sputtering process, the underlying layer 62 and the aluminum layer 64 are preferably formed under a reduced pressure and preferably in a continuous manner. By forming the underlying layer 62 and the aluminum layer 64 under a reduced pressure in a continuous manner, the generation of a concave can be suppressed with higher reliability. The aluminum layer 64 is made of aluminum or an alloy containing aluminum as a main component. One example of the alloy containing aluminum as a main component is Al—Cu. Also, the aluminum layer 64 may contain silicon or the like. The film thickness of the aluminum layer 64 is not particularly limited so long as it is within such a range as enabling the aluminum layer 64 to develop the function of wiring thereof, and is held, for example, in the range of 100–1000 nm.

Then, the reflection preventive film 66 may be formed on the aluminum layer 64. The material of the reflection preventive film 66 is not particularly limited, and can be, e.g., titanium nitride. Examples of methods usable for forming the reflection preventive film 66 include the sputtering and CVD process. In the case of forming both the aluminum layer 64 and the reflection preventive film 66 by the sputtering process, these layer and film may in certain embodiments be formed in a continuous manner. In such a case, it is further possible to form the underlying layer 63, the aluminum layer 64 and the reflection preventive film 66 in a continuous manner. The film thickness of the reflection preventive film 66 is not particularly limited, and may be held, for example, in the range of 10–150 nm.

Next, as shown in FIG. 1, the underlying layer 63, the aluminum layer 64 and the reflection preventive film 66 are patterned. The wiring layer 60 is thus formed. At the same time, the barrier layer 44 is also patterned. The patterning may be carried out by a well-known method, e.g., a method utilizing lithography or dry etching. In this way, the semiconductor device 100 according to this embodiment is completed.

Certain features of the manufacture method for the semiconductor device 100 according to this preferred embodiment are also preferred in other embodiments. These features include, but are not limited to the following. Preferably the underlying layer 62 and forming the aluminum layer 64 with the temperature of the substrate 20 being not lower than 250° C. and under a reduced pressure. By forming the aluminum layer 64 with the manufacture method for the semiconductor device having the features mentioned above, movement of aluminum atoms is promoted on the underlying layer 62 during the formation of the aluminum layer 64. It is therefore possible to suppress a concave from being generated in the upper area 64a of the aluminum layer 64 at a position above the recess 54, and to form the aluminum layer 64 having a substantially flat surface.

In addition, by forming the underlying layer 62 and the aluminum layer 64 in a continuous manner in addition to the above-described conditions, the generation of a concave can be suppressed with higher reliability. Consequently, the manufacture method for the semiconductor device 100 according to the preferred embodiment has a number of advantages, including the following.

First, with the preferred manufacture method, since a concave can be suppressed from being generated in the upper area 64a of the aluminum layer 64 at a position above the recess 54, formation of a stacked via is facilitated.

Second, with the preferred manufacture method, the step of machining the upper end portion of the interlayer insulating layer 40, which has been required in the related art 1, is no longer required. As a result, the problems of producing a large amount of particles and reducing yield are avoided.

Third, with the preferred embodiment, the reflow step which has been required in the related art 2 is no longer required. As a result, the number of steps can be reduced in comparison with the related art 2.

In one example of a preferred embodiment, the three layers constituting the wiring layer 60 were continuously formed on the interlayer insulating layer 40 and the plugs 50 having the recesses 54 by using a manufacturing method for the semiconductor device such as that described above . In other words, the underlying layer 62, the aluminum layer 64 and the reflection preventive film 66 were formed in a continuous manner by the sputtering process. As a result, no concave was generated in the upper area 64a of the aluminum layer 64 at a position above each of the recesses 54. The detailed forming conditions of the wiring layer 60 were as set forth in Table 1 below.

TABLE 1

Processing conditions for various layers according to a preferred embodiment.

|  | Underlying layer | Al layer | Reflection Preventive layer |
|---|---|---|---|
| Film thickness (nm) | 10 | 500 | 40 |
| Material | titanium | Al alloy (0.5 wt % Cu) | titanium nitride |
| Substrate temperature (° C.) | 50 | 300 | 250 |
| DC power (kW) | 12 | 5 | 6 |
| Distance between target & substrate (mm) | 100 | 75 | 100 |
| Ar flow rate (sccm) | 60 | 30 | 60 |
| $N_2$ flow rate (sccm) |  |  | 90 |
| Film forming rate (μm/min) | 1.0 | 1.0 | 0.4 |
| Pressure (Pa) | 0.5 | 0.3 | 0.6 |

Embodiments can be variously modified without departing from the scope and the gist of the present invention. The following modifications are, by way of example, possible.

In the above described preferred embodiment, the impurity diffusion layer 34 and the aluminum layer 64 are electrically connected to each other through the plug 50. However, the counterpart to which the aluminum layer 64 is electrically connected through the plug 50 is not limited to the impurity diffusion layer 34, and the aluminum layer 64 may be electrically connected to any other suitable conductive layer. Such a conductive layer may be wiring (e.g., a gate electrode or local wiring) formed on the surface of the substrate 20, or wiring formed on the interlayer insulating layer 40 positioned as any of the first layer and the second or more layer. Examples of materials usable for the wiring include metals having high melting points, such as tungsten and titanium, and silicides of metals having high melting points, such as tungsten silicide and titanium silicide. In addition to those examples, the material of the wiring may be, e.g., aluminum, an aluminum alloy, copper, or titanium nitride. Other materials in addition to those discussed above could also be used. In addition, while the MOS element 30 was the n-type in the above-described embodiment, it may alternatively be p-type.

What is claimed:

1. A method for forming a semiconductor device, comprising:

forming a conductive layer on or above a substrate;

forming, on said conductive layer, an insulating layer having at least one through hole therein;

forming a plug in said through hole;

forming a underlying layer on at least a portion of said plug; and forming a layer comprising aluminum on said underlying layer while maintaining a chamber pressure of not greater than approximately 1 Pa and while maintaining a substrate temperature of at least 250° C. and less than a reflow temperature of the layer comprising aluminum;

wherein said layer comprising aluminum is maintained at a temperature below its reflow temperature during any subsequent processing steps.

2. A method for forming a semiconductor device, comprising:

forming a conductive layer on or above a substrate;

forming, on said conductive layer, an insulating layer having at least one through hole therein;

forming a plug in said through hole;

forming a underlying layer on at least a portion of said plug; and forming a layer comprising aluminum on said underlying layer while maintaining a chamber pressure of not greater than approximately 1 Pa and while maintaining a substrate temperature in the range of approximately 250° C. to no greater than 300° C. wherein said substrate temperature is less than a reflow temperature of the layer comprising aluminum.

3. A method for forming a semiconductor device, comprising:

forming a first conductive layer on or above a substrate;

forming, on said first conductive layer, an insulating layer having at least one through hole therein;

filling the through hole with a conductive material and etching back the conductive material to form a plug in said through hole, said etching back being controlled to form a recess in an upper surface of said plug;

forming an underlying layer on said upper surface of said plug, the underlying layer being formed to include a recess in an upper surface thereof;

forming a second conductive layer on said underlying layer while maintaining a chamber pressure of not greater than 5 Pa and a substrate temperature of not less than 250° C.; and maintaining said second conductive layer at a temperature below its reflow temperature while forming said semiconductor device.

* * * * *